US 12,228,604 B2

(12) United States Patent
Bernard et al.

(10) Patent No.: US 12,228,604 B2
(45) Date of Patent: Feb. 18, 2025

(54) MONITORING AN IDEAL DIODE (71) Applicant: Continental Automotive Technologies GmbH, Hannover (DE)

(72) Inventors: Sebastien Bernard, Hattersheim (DE); Timo Dietz, Flörsheim (DE)

(73) Assignee: Continental Automotive Technologies GmbH, Hannover (DE)

( * ) Notice: Subject to any disclaimer, the term of this patent is extended or adjusted under 35 U.S.C. 154(b) by 100 days.

(21) Appl. No.: 18/000,606

(22) PCT Filed: Jun. 2, 2021

(86) PCT No.: PCT/DE2021/200075
§ 371 (c)(1),
(2) Date: Dec. 2, 2022

(87) PCT Pub. No.: WO2021/244713
PCT Pub. Date: Dec. 9, 2021

(65) Prior Publication Data
US 2023/0228804 A1 Jul. 20, 2023

(30) Foreign Application Priority Data
Jun. 5, 2020 (DE) .................... 10 2020 207 055.5

(51) Int. Cl.
*G01R 31/26* (2020.01)
*G01R 19/165* (2006.01)
(Continued)

(52) U.S. Cl.
CPC ... *G01R 31/2632* (2013.01); *G01R 19/16576* (2013.01); *H03K 17/687* (2013.01); *B60T 17/22* (2013.01)

(58) Field of Classification Search
CPC .. G01R 31/2632–2635; G01R 31/2621; G01R 19/16576; H03K 17/687;
(Continued)

(56) References Cited

U.S. PATENT DOCUMENTS 4,949,211 A * 8/1990 Edwards ............ H03K 17/0822
323/901
6,060,943 A 5/2000 Jansen
(Continued)

FOREIGN PATENT DOCUMENTS

CN 106199369 12/2016
CN 110391472 A 10/2019
(Continued)

OTHER PUBLICATIONS

Office Action dated Feb. 20, 2024; of counterpart Korean application 10-2022-7040193.
(Continued)

*Primary Examiner* — Lee E Rodak
*Assistant Examiner* — Demetrius R Pretlow (57) ABSTRACT A method for monitoring an ideal diode comprises controlling a source-gate voltage of a MOSFET of the ideal diode such that the ideal diode can be changed between an off and an on state with a first target value for a source-drain voltage. To detect error states, the source-drain voltage and the source-gate voltage are measured. A check is carried out to determine whether the source-drain voltage reaches the first target value within predefined error limits in the on state. A test mode is carried out, in which a second target value, smaller than the first target value, is set for the source-drain voltage. A check is carried out to determine whether the source-gate voltage reaches an upper threshold value when
(Continued)

the test mode is being carried out. An error signal is output when the first target value and/or the upper threshold value is/are not reached.

22 Claims, 5 Drawing Sheets

(51) Int. Cl.
  *H03K 17/687* (2006.01)
  *B60T 17/22* (2006.01)
(58) Field of Classification Search
  CPC ............ H03K 17/18; H03K 2017/307; H03K 2217/0027; B60T 17/22
  See application file for complete search history.

(56) References Cited

U.S. PATENT DOCUMENTS

| | | | |
|---|---|---|---|
| 2008/0048877 A1 | 2/2008 | Takahashi | |
| 2015/0061726 A1* | 3/2015 | Kawa | G01R 31/2621 |
| | | | 324/762.09 |
| 2016/0105101 A1 | 4/2016 | Johnson, III | |
| 2019/0369151 A1 | 12/2019 | Meiser et al. | |
| 2019/0372501 A1* | 12/2019 | Wada | B62D 5/0403 |
| 2021/0021137 A1 | 1/2021 | Zeng et al. | |
| 2021/0184583 A1* | 6/2021 | Tanghe | H02M 1/08 |

FOREIGN PATENT DOCUMENTS

| | | |
|---|---|---|
| DE | 102007031494 A1 | 2/2008 |
| DE | 60133277 T2 | 4/2009 |
| DE | 102019114071 A1 | 12/2019 |
| JP | 2009194791 A | 8/2009 |

OTHER PUBLICATIONS

German Search Report dated Feb. 11, 1021 for the counterpart German Patent Application No. 10 2020 207 055.5.
The International Search Report and the Written Opinion of the International Searching Authority mailed on Aug. 26, 2021 for the counterpart PCT Application No. PCT/DE2021/200075.
Picor, "Active ORing Solutions in Redundant Power System Architectures", Oct. 2011.
Picor, Universal Active ORing Controller IC, 2019.
Texas Instruments, Ideal diode/ORing controllers—Products.
Texas Instruments, LM5050-1/Q1 High-Side OR-ing FET Controller.
Vicor Corporation, Cool-ORing.
ViCOR PowerBlog, GERMANY, Back to Basics: What is Active ORing?, Sep. 4, 2013.
Office Action dated Aug. 8, 2024; of counterpart Korean application 10-2022-7040193.

* cited by examiner

MONITORING AN IDEAL DIODE

CROSS-REFERENCE TO RELATED APPLICATIONS

This U.S. patent application claims the benefit of PCT patent application No. PCT/DE2021/200075, filed Jun. 2, 2021, which claims the benefit of German patent application No. 10 2020 207 055.5, filed Jun. 5, 2020, both of which are hereby incorporated by reference.

TECHNICAL FIELD

The invention relates to a method for monitoring an ideal diode and to a corresponding circuit arrangement.

BACKGROUND

In motor vehicles it is essential to ensure uninterrupted availability of critical systems, for example the vehicle brake. Such systems are therefore often connected to two independent voltage supplies as the energy source, which must be mutually protected from one another so that a fault in one voltage supply cannot damage the other voltage supply. A simple solution to this is to connect one semiconductor diode between the voltage supply and the load. However, this has the disadvantage that the diodes have a relatively high voltage drop and thus lead to a large power loss. Furthermore, the high voltage drop in the supply path reduces the availability of the system.

Active ORing is an alternative. In this case, the diodes are replaced with a low-impedance power transistor, for example a MOSFET (power FET), whose gate voltage is controlled in order to simulate the function of a diode. Control ensures that the voltage difference between the source and drain electrodes corresponds to almost 0 V, for example a target value of 50 mV, when the transistor current flows in the direction of the load (forward current), and that the transistor is switched off when the transistor current flows in the direction of the supply source (reverse current). The power FET thus behaves like an ideal diode: The element is quasi-short-circuited, which provides a very small voltage drop, for the forward current and completely blocked for the reverse current. In the future oriented toward autonomous vehicles, such a concept with two supply sources and an ideal diode as the central element will become more and more important.

There are already integrated controllers for ideal diodes or complete ORing circuits. These are designed to keep the controlled source-drain voltage drop at a target value during forward current and to turn off or open the power FET very quickly in the event of reverse current.

However, these circuits do not have mechanisms that ensure full fault monitoring, as required for uses in system-critical applications in vehicles.

SUMMARY

A method in which the source-drain voltage, that is to say the voltage between the source electrode and the drain electrode of the MOSFET, and the source-gate voltage, that is to say the voltage between the source electrode and the gate electrode of the MOSFET, are measured. The measurement range of the source-drain voltage should be at least 0 mV to 100 mV. In this case, a check is carried out in order to determine whether the source-drain voltage reaches the first target value within predefined error limits when the ideal diode is in the on state. For example, plus or minus 50% around the target value can be set as error limits. The range of fluctuation of the value can also be determined in the error-free case and the error limits can be set in such a way that the error-free range of fluctuation is just contained.

A test mode is also carried out, in which the source-drain voltage is controlled to a second target value which is smaller than the first target value. In this case, a check is carried out in order to determine whether the source-gate voltage reaches an upper threshold value when the test mode is being carried out. If the first target value and/or the upper threshold value is/are not reached, a corresponding error signal is output.

In the case of integrated circuits that form an ideal diode, the three following pins should therefore be accessible from the outside. The anode of the ideal diode. This node is typically the output of a supply source of the system and at the same time the source connection of the MOSFET. The cathode of the ideal diode. This node is typically the input of the system load and at the same time the drain connection of the MOSFET. The control input of the ideal diode. This node is typically the gate connection of the MOSFET, whose voltage is controlled by the integrated circuit in order to realize the functionality of an ideal diode. After AD conversion, the potentials of these nodes are made available to an integrated logic unit or a computing unit.

In one embodiment, the first target value is 30 mV to 200 mV, e.g. 50 mV. In order to avoid losses, the first target value is therefore selected to be as low as possible, but only so low that a reverse current is reliably avoided.

In one embodiment, the second target value is less than 30 mV, for example less than 15 mV, e.g. 0 mV. The second target value is therefore selected to be so small that it cannot normally be reached at all. The control of the ideal diode therefore increases the gate voltage further and further until a maximum value is reached. This results from the upper supply voltage of the control, for example an operational amplifier used for control. In error-free operation, the gate voltage will thus exceed the upper threshold value.

In a further embodiment, the measurements of the source-drain voltage and/or the source-gate voltage are carried out when the source-drain current is greater than 1 mA. The measurements may therefore be carried out during operation. Although the resistance of a MOSFET is much lower than that of a diode, it is not infinitely small. The current thus causes a voltage drop that has to be compensated for in the test mode by adjusting the gate voltage by increasing the gate voltage. In the error-free case, the upper threshold value is thus reliably reached. The measurements, for example the measurements during the test mode, may be carried out when the current is less than 40 A. Then the source-drain voltage is not in saturation due to the internal resistance of the MOSFET and can vary when changing over between the test mode and the on state.

In a further embodiment, the measurements of the source-drain voltage and/or the source-gate voltage are carried out using an analog-to-digital converter, and the test mode is carried out for a test time that is greater than a conversion time of the analog-to-digital converter, for example greater than five conversion times. This ensures that reliable data acquisition can take place. The robustness of the measurement may be further increased by a test time extended to five conversion times with the corresponding measurement.

In a further embodiment, an analog-to-digital converter with a sigma-delta architecture is used to measure the source-drain voltage and/or the source-gate voltage. The analog-to-digital converters to be used only require an accuracy of approximately 5% in relation to their conversion range. With these requirements, a sigma-delta architecture is a candidate, because the required area of the electronic components is smaller than that of other analog-to-digital converter architectures.

In a further embodiment, the upper threshold value is greater than a threshold voltage of the MOSFET. For example, a value of 8 V can be used as the upper threshold value.

In a further embodiment, an error with swapped connection pins of the ideal diode is recognized by the fact that the source-gate voltage does not reach the upper threshold value when the test mode is being carried out.

In a further embodiment, measurement points for measuring the source-drain voltage and the source-gate voltage are connected to a current sink in order to keep their voltage clearly defined in all states. This can be done passively, by means of a high-value (for example 1 kohm to 50 kohm) resistor to ground, or it can be in the form of an active current sink.

In a further embodiment, an error with an open source connection of the ideal diode is recognized by the fact that, in the on state of the ideal diode, the source-drain voltage becomes less than the first target value, for example less than half of the first target value, e.g. zero.

In a further embodiment, an error with an open drain connection of the ideal diode is recognized by the fact that, in the on state of the ideal diode, the source-drain voltage becomes greater than the first target value, for example greater than twice the first target value, e.g. reaches a maximum value. Depending on the circuit arrangement, the maximum value can correspond to the source potential, for example.

In a further embodiment, an error with an open gate connection of the ideal diode is recognized by the fact that no change in the source-drain voltage is detected when changing over between the test mode and the on state of the ideal diode.

A circuit arrangement for monitoring an ideal diode, has a MOSFET with a drain electrode, a source electrode and a gate electrode, and a control unit which is configured to control a source-gate voltage of the MOSFET in such a manner that the ideal diode can be changed over between an off state and an on state with a first target value for the source-drain voltage. A monitoring unit is also provided and is configured to measure the source-drain voltage and the source-gate voltage and to check, in the on state of the ideal diode, whether the source-drain voltage reaches the first target within predefined error limits, and the monitoring unit is also configured to carry out a test mode by setting a second target value for the source-drain voltage that is smaller than the first target value, and checking whether the source-gate voltage reaches an upper threshold value when the test mode is being carried out, and outputting an error signal if at least one of the values is not reached.

A circuit arrangement has a load and two voltage supplies, which are each connected to the load via an ideal diode, wherein at least one of the ideal diodes is designed as the circuit arrangement described above.

Further features, advantages and possible applications also result from the description below of exemplary embodiments and the drawings. All of the features described and/or pictorially depicted belong to the subject matter of the invention both individually and in any combination, also independently of their summarization in the claims or the back-references thereof.

BRIEF DESCRIPTION OF THE DRAWINGS

The present disclosure will become more fully understood from the detailed description and the accompanying drawings, wherein.

DETAILED DESCRIPTION

Figure 1:
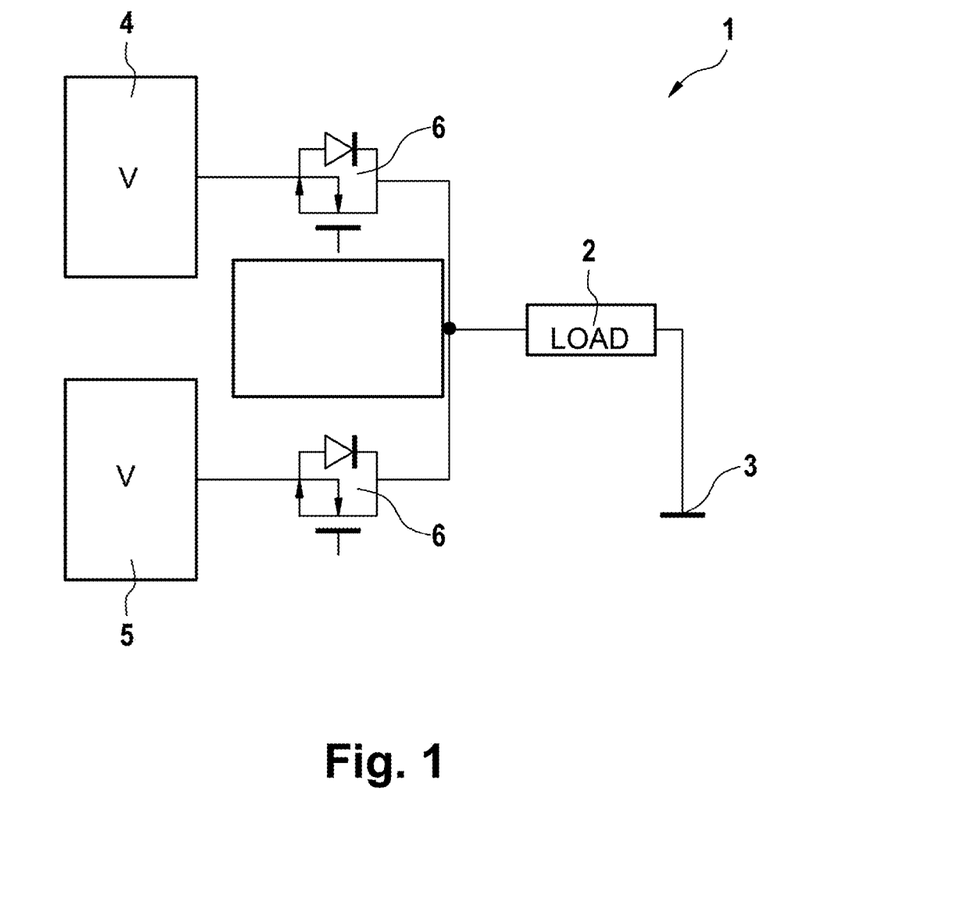
FIG. 1 schematically shows a circuit arrangement having ideal diodes.

FIG. 1 shows a circuit arrangement 1 as is used for the redundant energy supply of a load 2. A circuit arrangement 1 of this type is used in brake systems of motor vehicles in which, for example, a hydraulic pump with corresponding electronics must be redundantly supplied with electrical energy as a load 2. The load 2 therefore has, in addition to a first (ground) connection 3, a connection to a first voltage supply 4 and a second voltage supply 5, which is formed via an ideal diode 6 in each case. The ideal diodes 6 prevent shunt currents from being able to flow between the first voltage supply 4 and the second voltage supply 5, in order to ensure that a fault in one of the voltage supplies 4, 5 cannot spread to the other voltage supply 5, 4 in each case.

Figure 2:
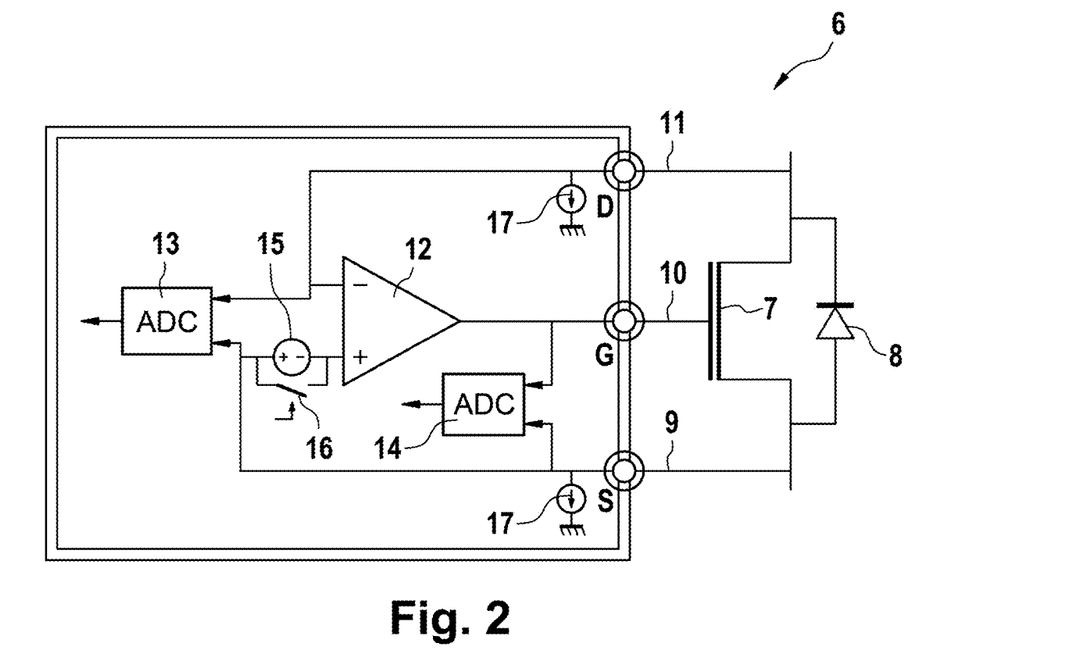
FIG. 2 schematically shows a circuit arrangement according to a first embodiment.

FIG. 2 illustrates the circuit of an ideal diode 6 in detail. The ideal diode 6 has, as a central element, a MOSFET 7 which is in the form of a power MOSFET. Internally, this has a bulk diode 8 whose anode is connected to the source connection 9 of the MOSFET 7 and whose cathode is connected to the drain connection 11 of the MOSFET 7. The source 9, gate 10 and drain 11 of the MOSFET 7 are connected to corresponding connections D, G, S of an integrated circuit. The source 9 is connected to the source connection S, the gate 10 is connected to the gate connection G and the drain 11 is connected to the drain connection D.

The drain connection D is connected internally in the control electronics to an inverting input (−) of an operational amplifier 12 and the source connection S is connected internally to the non-inverting input (+) of the operational amplifier 12 via a voltage specification 15. The voltage specification 15 corresponds to the first target value which is set by the control. The output of the operational amplifier 12 is applied to the gate 10 of the MOSFET 7 via the gate connection G and thus outputs the output signal for controlling the MOSFET 7. The voltage at the gate 10 is accordingly controlled in such a manner that the voltage between the drain 11 and the source 9, and thus between the inverting input (−) and the non-inverting input (+) of the operational amplifier 12, corresponds exactly to the voltage specification 15.

In normal forward-biased operation of the ideal diode, the voltage at the source 9 is higher than at the drain 11. The electrical current then flows essentially through the MOSFET 7, since the operational amplifier 12 controls the gate 10 voltage in such a manner that the source-drain voltage corresponds to the voltage specification 15 which is lower than the voltage drop across a diode. Since the source-drain voltage, and therefore the bulk diode voltage, is therefore less than 100 mV, the bulk diode current is negligible in the order of magnitude of one microampere.

In the case of very large currents, even in the error-free case, the source-drain voltage does not quite reach the first target value, but is somewhat higher because the MOSFET has a finite internal resistance. For example, with a maximum current of 120 A and an internal resistance of 1 Mohm, the voltage drop becomes 120 mV. The corresponding predefined upper error limit can accordingly be set in such a manner that no error is output either for such an error-free case with a maximum current. In this example, the upper error limit could thus be set at 140 mV.

As soon as the electrical potential at the source 9 becomes smaller than the potential at the drain 11, that is to say the source-drain voltage becomes negative, the output signal at the gate 10 becomes minimal. Depending on the wiring of the operational amplifier, this can be 0 V or even a negative value, for example. If the minimum value is present at the gate 10 of the MOSFET 7, it turns off completely.

To monitor the functionality of the ideal diode 6, the circuit has an analog-to-digital converter 13 which measures and digitizes the voltage difference between the drain connection D and the source connection S and therefore between the drain 11 and the source 9 of the MOSFET 7. The digitized measurement result is supplied to a computing unit that serves as a monitoring unit. In addition, the voltage between the gate 10 and the source 9 is measured by another analog-to-digital converter 14 and made available to the monitoring unit in digital form. In addition, a bridging switch 16 is provided and can short-circuit the voltage specification 15 on the command of the monitoring unit and thus reduces the target value specification of the circuit to 0 V. In this case, the voltage at the gate 10 is controlled by the operational amplifier 12 in such a manner that the voltage between the source 9 and the drain 11 corresponds to 0 V.

An active current sink 17 is respectively provided at the drain connection D and the source connection S and lowers the electrical potential to 0 V if the corresponding connection is open. If the connection is not open, the current sink will only result in a very small current through the connection.

If the bridging switch 16 is triggered during normal forward-biased operation and the control target value is thus set to 0 V, the operational amplifier 12 attempts to output a voltage at the gate 10, with the result that the source-drain voltage becomes 0 V. Since a current not equal to 0 A flows through the MOSFET 7 during operation and this has a small but finite resistance, a source-drain voltage of 0 V cannot be achieved. The control will therefore increase the voltage at the gate 10 up to a maximum value which corresponds to the supply voltage of the operational amplifier 12 for the case shown.

The monitoring unit checks the correct functionality on the one hand by whether the source-drain voltage reaches the target value within predefined error limits during normal operation in the on state. It also outputs a signal to the bridging switch 16 to bridge the voltage specification 15 and thus set the target value for the source-drain voltage to 0 V. In this test mode, the monitoring unit checks whether the gate voltage actually increases and thus exceeds an upper threshold value. If the target value does not reach the upper threshold value in normal operation, in the on state, and/or the voltage at gate 10 does not rise above the upper threshold value in the test mode, an error signal is output. The various errors are considered individually in FIG. 4 to FIG. 10.

Figure 3:
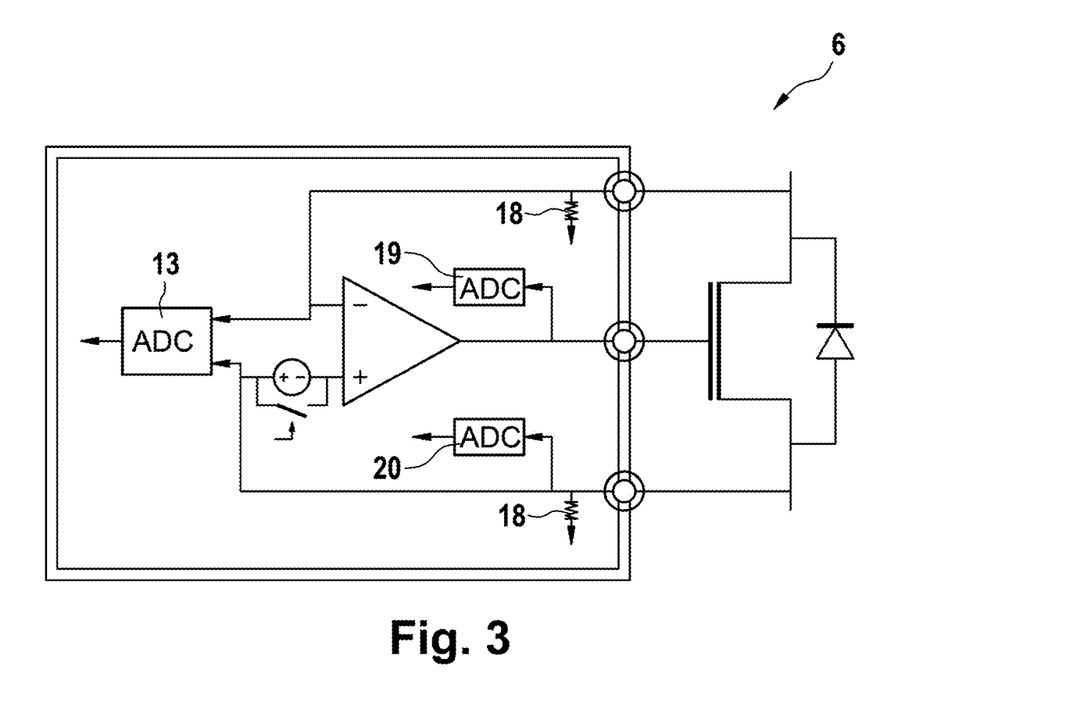
FIG. 3 schematically shows a circuit arrangement according to a second embodiment.

FIG. 3 shows an alternative embodiment which corresponds to the embodiment in FIG. 2 except for a few details. Instead of the analog-to-digital converter 14 in the embodiment in FIG. 2, the embodiment in FIG. 3 has two further analog-to-digital converters 19 and 20 in addition to the analog-to-digial converter 13. The analog-to-digital converter 19 measures and digitizes the voltage between the gate G and ground, and the analog-to-digital converter 20 measures the voltage between the source S and ground. The voltage between the source S and the gate G can be calculated accordingly by subtracting the potentials from each other. Instead of the active current sinks 17, the source connection S and the drain connection D are connected to passive current sinks which are in the form of high-value resistors, for example with 50 kohm.

Figure 4:
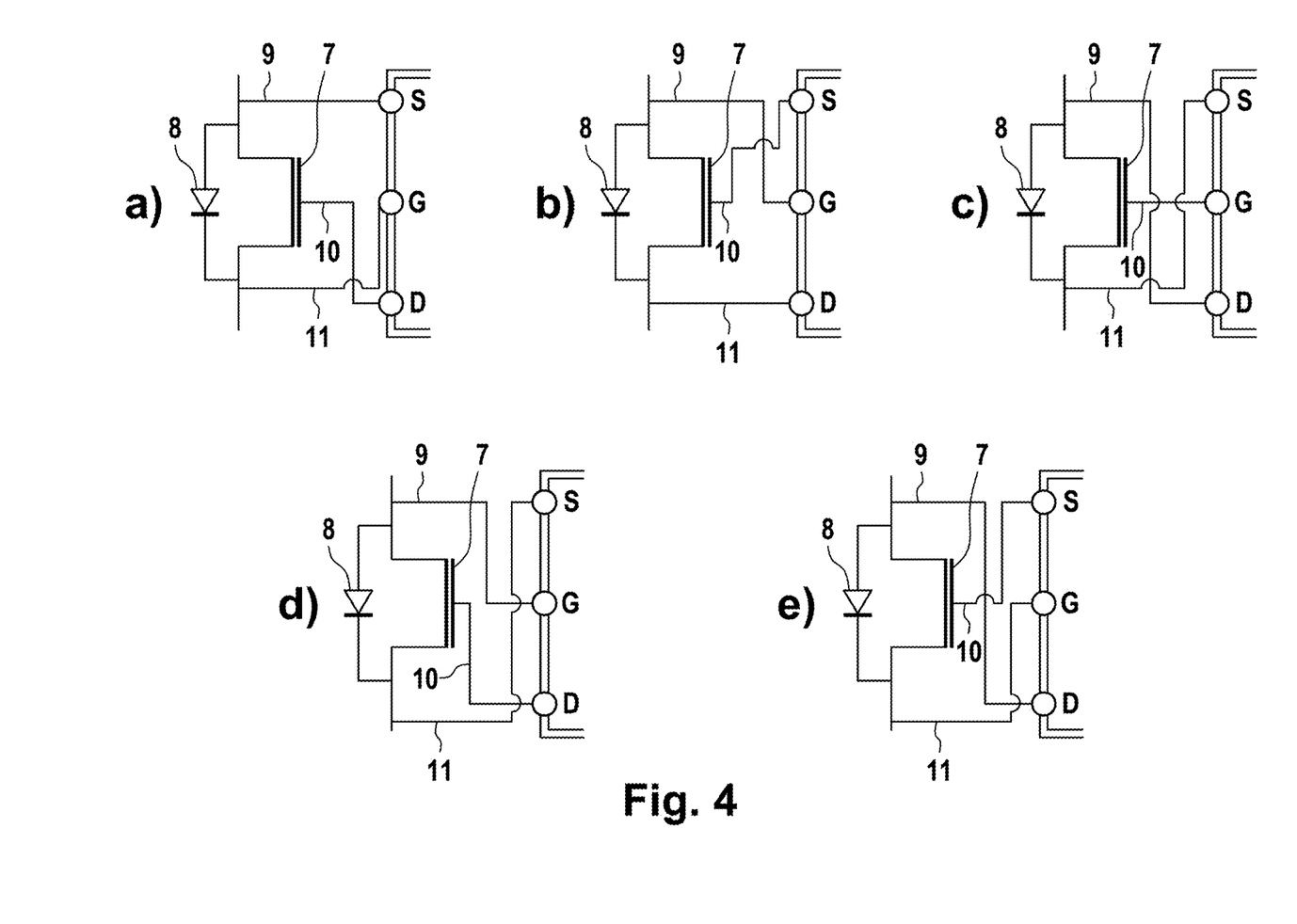
FIG. 4a schematically shows an ideal diode with first incorrect pin wiring.
FIG. 4b schematically shows an ideal diode with second incorrect pin wiring.
FIG. 4c schematically shows an ideal diode with third incorrect pin wiring.
FIG. 4d schematically shows an ideal diode with fourth incorrect pin wiring.
FIG. 4e schematically shows an ideal diode with fifth incorrect pin wiring.

FIG. 4a shows a detail from the circuit arrangement in FIG. 2 or 3, which represents the connection of the MOSFET 7 with the source 9, the gate 10 and the drain 11 to the control electronics via the source connection S, the gate connection G and the drain connection D. FIG. 4a shows incorrect pin wiring in which the gate G and the drain D are swapped. Activating the test mode, in which the target value of the source-drain voltage is controlled to 0 V, does not cause the gate voltage to rise above the upper threshold value. Accordingly, the incorrect pin wiring can be detected.

FIG. 4b shows a detail corresponding to FIG. 4a, in which the source connection S and the gate connection G are swapped. In this case too, no high gate voltage that would exceed the upper threshold value is measured when the test mode is being carried out. Accordingly, the error is also detected in this case.

FIG. 4c accordingly illustrates the case in which the source S and the drain D are connected in a swapped manner and the control therefore always sees a negative input value, that is to say a value smaller than the target value of 0 V that has been set, in the test mode. Accordingly, in this case too, no gate voltage that goes above the upper threshold value is adjusted.

FIG. 4d illustrates the case in which the source connection S is connected to the drain electrode 11 of the MOSFET 7, the gate connection G is connected to the source 9 of the MOSFET 7 and the drain connection D is connected to the gate 10 of the MOSFET 7. Even in this state, no gate voltage going above the upper threshold value is detected when the test mode is being carried out, and the defect can be detected.

Further swapped pin wiring is illustrated in FIG. 4e, in which the source connection S is connected to the gate 10 of the MOSFET 7, the gate connection G is connected to the drain 11 of the MOSFET 7 and the drain connection D is connected to the source 9 of the MOSFET 7. Accordingly, in normal operation, in the on state, the negative source voltage is measured as the drain-source voltage and the target value is therefore not reached.

Figure 5:
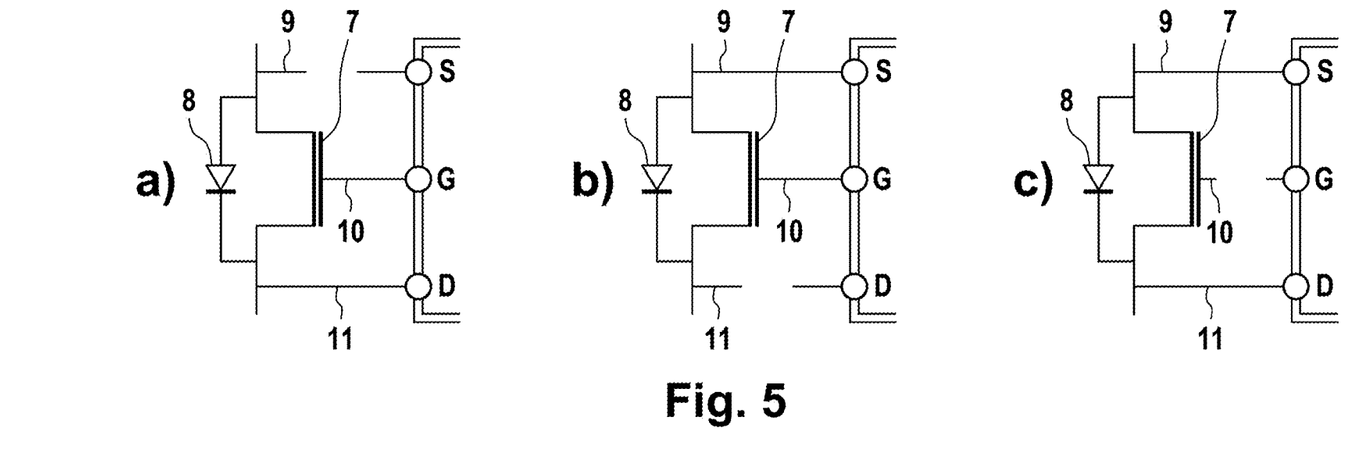
FIG. 5a schematically shows an ideal diode with an open pin.
FIG. 5b schematically shows an ideal diode with another open pin.
FIG. 5c schematically shows an ideal diode with a further open pin.

FIG. 5a now illustrates the detail corresponding to FIGS. 4a to 4e for the case of an open source connection. The source 9 of the MOSFET 7 is not connected to the source connection S. In normal operation, when the operational amplifier 12 is intended to control the source-drain voltage to the target value of the voltage specification 15, a measurement of the voltage between the source S and the drain D results in 0 V. Accordingly, the error can be detected.

FIG. 5b shows the case of an open drain connection, in which the drain 11 is not connected to the drain connection D. The voltage measurement between the source and the drain results in a maximum value and thus a large deviation from the expected target value. Accordingly, the error is also detected in this case.

FIG. 5c illustrates the case in which the gate 10 is not connected to the gate connection G. The control of the gate voltage at the gate connection G therefore has no influence on the gate 10 and thus on the MOSFET 7. The source-drain voltage can therefore only coincidentally correspond to the target value from the voltage specification 15. If it does not do this, the error is detected directly. If the source-drain voltage coincidentally corresponds to the target value, this does not change, however, when changing over to the test mode. This can be detected and the error can thus be detected. In this case, the test mode can be carried out at a low current, for example less than 40 A.

Figure 6:
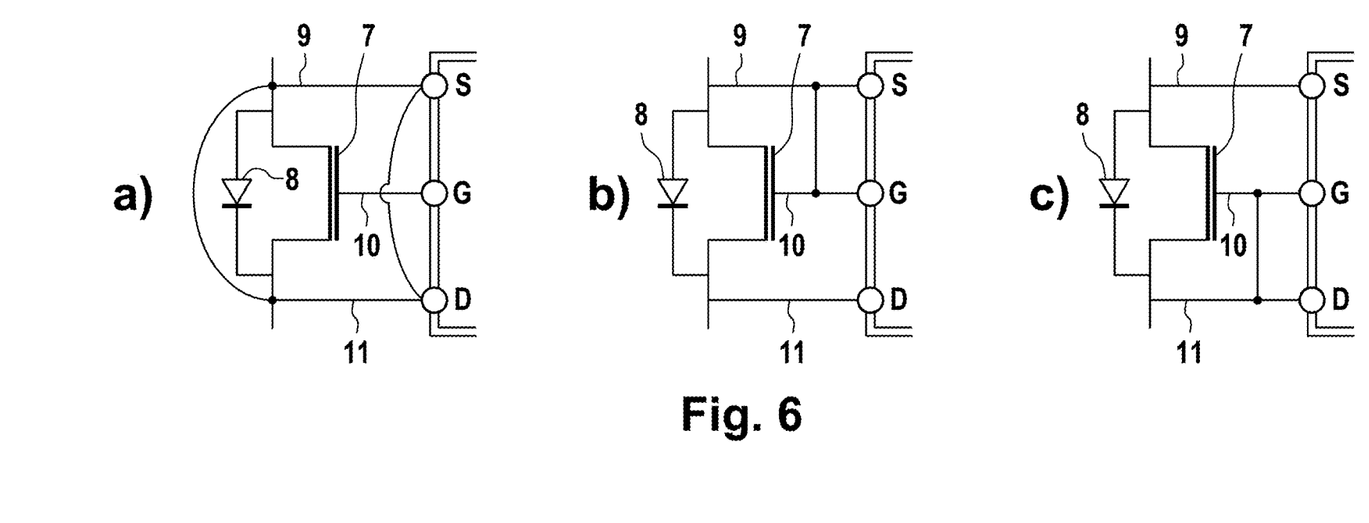
FIG. 6a schematically shows an ideal diode with a short circuit.
FIG. 6b schematically shows an ideal diode with a different short circuit.
FIG. 6c schematically shows an ideal diode with a further short circuit.

FIG. 6a shows a short circuit which short-circuits the source connection S to the drain connection D or the source 9 and the drain 11. In this case, the source-drain voltage can never reach the target value specified by the voltage specification 15, but rather is 0 V. The error can thus be detected.

A short circuit between the gate G and the source S is illustrated in FIG. 6b. In this case, the test mode cannot lead to a higher gate voltage above the upper threshold value, which allows the error to be detected.

A short circuit between the gate connection G and the drain connection D is illustrated in FIG. 6c. In this case too, no gate voltage above the upper threshold value can be measured in the test mode.

Figure 7:
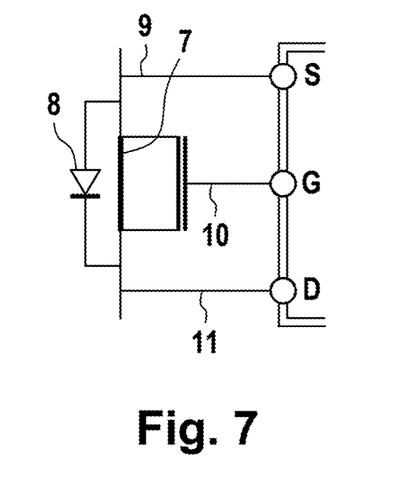
FIG. 7 schematically shows an ideal diode with a short-circuited MOSFET.

In FIG. 7, the MOSFET is internally short-circuited. A short circuit can theoretically have any internal resistance values. In all cases, however, the transistor channel resistance is independent of the set gate voltage and control is thus interrupted. The non-closed control loop means that the control goes directly into saturation. The gate-source voltage will therefore reach either the maximum or minimum value.

In this case too, the voltage between the drain 11 and the source 9 is independent of the gate voltage and therefore does not change when changing over to the test mode. This can be detected and the error can thus be detected. The test mode can again be carried out at a low current, for example less than 40 A.

Figure 8:
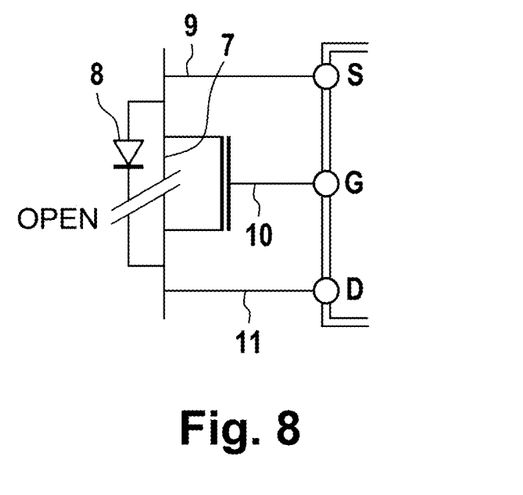
FIG. 8 schematically shows an ideal diode with an open MOSFET.

FIG. 8 shows the case of an open MOSFET 7 and thus a permanently disconnected connection to the voltage supply 4. If the entire system has only a single supply source (voltage supply), the open MOSFET means that the entire system has no power supply and is therefore not operational.

If there is a second voltage supply 5, then there is a power supply and the voltage of the second supply source 5 is present at the drain connection D. If this coincidentally means that the source-drain voltage corresponds to the target value, the error can again be detected by the fact that the drain-source voltage is independent of the control and therefore no change occurs when changing over to the test mode.

Figure 9:
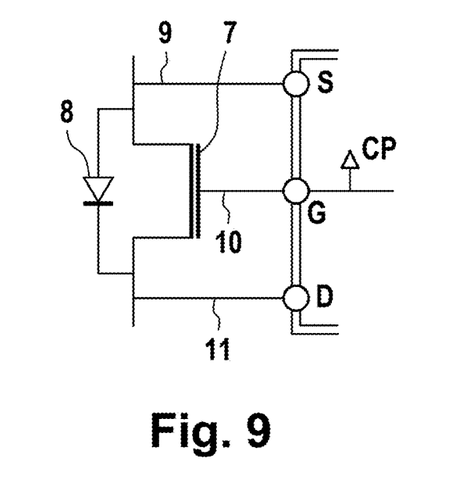
FIG. 9 schematically shows an ideal diode with a stuck gate.

FIG. 9 shows the case in which the output of the control, the gate connection G, is fixed to the operating voltage (VCD). In this case, the MOSFET 7 is permanently fully switched on and the source-drain channel thus has its minimum resistance. This means that the voltage difference between the source and the drain becomes smaller than the target value specified by the voltage specification 15 if the current is low enough. Since the current load very often assumes a small value in typical braking systems, the error is therefore detected as soon as a small current value occurs.

Figure 10:
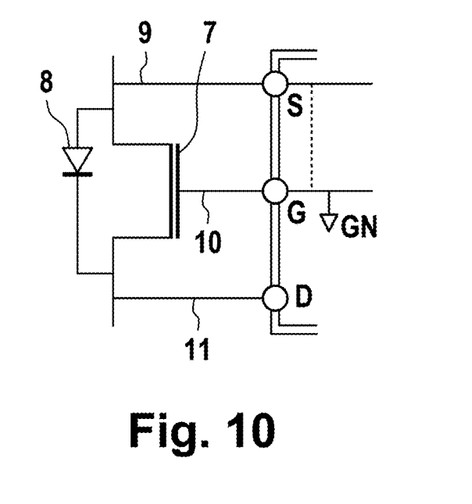
FIG. 10 schematically shows an ideal diode with a stuck gate to ground.

FIG. 10 illustrates a further case in which the output of the control, the gate connection G, is fixed to ground or to the source voltage. In this case, no increased output voltage is measured when the test mode is activated and the error can thus be detected.

The method therefore makes it possible to be able to detect all errors that can occur in a system.

The invention claimed is:

1. A method for monitoring an ideal diode having a MOSFET with a drain electrode, a source electrode and a gate electrode comprising:
   controlling a source-gate voltage of the MOSFET such that the ideal diode can be changed over between an off state and an on state with a first target value for a source-drain voltage;
   measuring the source-drain voltage and the source-gate voltage;
   checking to determine whether the source-drain voltage reaches the first target value within predefined error limits in the on state of the ideal diode;
   carrying out a test mode to set a second target value which is smaller than the first target value for the source-drain voltage;
   checking to determine whether the source-gate voltage reaches an upper threshold value when in the test mode; and
   outputting an error signal when at least one of the first target value and the upper threshold value is not reached.

2. The method as claimed in claim 1, wherein the first target value is 30 mV to 200 mV.

3. The method as claimed in claim 1, wherein the first target value is 40 mV to 100 mV.

4. The method as claimed in claim 1, wherein the first target value is 50 mV.

5. The method as claimed in claim 1, wherein the second target value is less than 30 mV.

6. The method as claimed in claim 1, wherein the second target value is less than 15 mV.

7. The method as claimed in claim 1, wherein the second target value is less than 0 mV.

8. The method as claimed in claim 1, wherein carrying out the measurements of at least one of the source-drain voltage and the source-gate voltage occurs when the source-drain current is greater than 1 mA and less than 40 A.

9. The method as claimed in claim 1, wherein carrying out the measurements of at least one of the source-drain voltage and the source-gate voltage occurs during operation.

10. The method as claimed in claim 1, wherein carrying out the measurements of at least one of the source-drain voltage and the source-gate voltage further comprises using an analog-to-digital converter, and the test mode is carried out for a test time that is greater than a conversion time of the analog-to-digital converter.

11. The method as claimed in claim 10, wherein the test time is greater than five conversion times.

12. The method as claimed in claim 10, wherein the analog-to-digital converter having a sigma-delta architecture is used to measure at least one of the source-drain voltage and the source-gate voltage.

13. The method as claimed in claim 1, wherein the upper threshold value is greater than a threshold voltage of the MOSFET.

14. The method as claimed in claim 1, further comprising recognizing an error with swapped connection pins of the ideal diode when the source-gate voltage does not reach the upper threshold value when the test mode is being carried out.

15. The method as claimed in claim 1, further comprising connecting measurement points for measuring the source-drain voltage and the source-gate voltage to a current sink.

16. The method as claimed in claim 1, further comprising recognizing an error with an open source connection of the ideal diode by the fact that, in the on state of the ideal diode, the source-drain voltage becomes less than the first target value.

17. The method as claimed in claim 16, wherein the source-drain voltage becomes less than half of the first target value.

18. The method as claimed in claim 16 wherein the source-drain voltage becomes zero.

19. The method as claimed in claim 1, further comprising recognizing an error due to an open drain connection of the ideal diode when in the on state of the ideal diode, the source-drain voltage becomes greater than the first target value.

20. The method as claimed in claim 19, wherein the source-drain voltage becomes greater than twice the first target value.

21. The method as claimed in claim 1, wherein an error, with an open gate connection of the ideal diode, is recognized by the fact that no change in the source-drain voltage is detected when changing over between the test mode and the on state of the ideal diode.

22. A circuit arrangement for monitoring an ideal diode comprising:
   a MOSFET with a drain electrode, a source electrode and a gate electrode;
   a control unit configured to control a source-gate voltage of the MOSFET such that the ideal diode can be changed over between an off state and an on state with a first target value for the source-drain voltage; and
   a monitoring unit configured to measure the source-drain voltage and the source-gate voltage and to check, in the on state of the ideal diode, whether the source-drain voltage reaches the first target within predefined error limits, and wherein the monitoring unit is also configured to carry out a test mode by setting a second target value for the source-drain voltage that is smaller than the first target value, and checking whether the source-gate voltage reaches an upper threshold value when the test mode is being carried out, and outputting an error signal if at least one of the values is not reached.

\* \* \* \* \*